United States Patent
Grodzki (10) Patent No.: US 10,073,158 B2
(45) Date of Patent: Sep. 11, 2018

(54) NOISE OPTIMIZATION FOR A MAGNETIC RESONANCE SYSTEM

(71) Applicant: Siemens Aktiengesellschaft, München (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 724 days.

(21) Appl. No.: 14/656,952

(22) Filed: Mar. 13, 2015

(65) Prior Publication Data

US 2015/0260817 A1   Sep. 17, 2015

(30) Foreign Application Priority Data

Mar. 13, 2014   (DE) .................. 10 2014 204 665

(51) Int. Cl.
| | |
|---|---|
| *G01R 33/54* | (2006.01) |
| *G01R 33/34* | (2006.01) |
| *G01R 33/56* | (2006.01) |
| *G01R 33/30* | (2006.01) |
| G01R 33/28 | (2006.01) |
| G01R 33/565 | (2006.01) |

(52) U.S. Cl.
CPC .......... *G01R 33/543* (2013.01); *G01R 33/288* (2013.01); *G01R 33/56518* (2013.01)

(58) Field of Classification Search
CPC ................. G01R 33/543; G01R 33/288; G01R 33/56518
USPC ........................................................ 324/309
See application file for complete search history.

(56) References Cited

U.S. PATENT DOCUMENTS

| | | | |
|---|---|---|---|
| 4,893,082 A | 1/1990 | Letcher, III | |
| 5,758,646 A * | 6/1998 | Van Der Meulen ... | G01R 33/54 324/309 |
| 6,407,548 B1 | 6/2002 | Dietz | |
| 6,452,391 B1 | 9/2002 | Bernstein et al. | |
| 7,301,341 B2 * | 11/2007 | Hargreaves .......... | G01R 33/561 324/307 |
| 7,791,338 B2 * | 9/2010 | Kim .................... | G01R 33/561 324/307 |
| 2005/0197793 A1 | 9/2005 | Baker | |
| 2011/0241680 A1 | 10/2011 | Mossnang et al. | |
| 2013/0249549 A1 | 9/2013 | Pfeuffer et al. | |
| 2013/0275086 A1 | 10/2013 | Grodzki et al. | |
| 2014/0232396 A1 | 8/2014 | Grodzki et al. | |
| 2015/0070012 A1 * | 3/2015 | Griswold .............. | G01R 33/56 324/309 |
| 2015/0160317 A1 | 6/2015 | Grodzki | |

FOREIGN PATENT DOCUMENTS

CN              1226144 A     8/1999

\* cited by examiner

*Primary Examiner* — Melissa Koval
*Assistant Examiner* — Rahul Maini
(74) *Attorney, Agent, or Firm* — Schiff Hardin LLP (57) ABSTRACT

In a magnetic resonance (MR) apparatus and method to evaluate the consistency of a signal model used to generate a quantitative parameter map, the residual of the quantitative parameter map is calculated and a residual map is generated. The residual map is displayed together with the quantitative parameter map, with the residual map serving as an indicator of the quality of fit of the signal model.

14 Claims, 2 Drawing Sheets

- Determine Frequency Spectrum Resulting From Application of Different Optimization Methods — 2.I
- Determine Overall Spectrum by Mutiplying Frequency Spectrum With Transmission Function of MR Scanner — 2.II
- Select Optimization Method that Produced the Overall Spectrum That Best Satisfies a Criterion — 2.III

NOISE OPTIMIZATION FOR A MAGNETIC RESONANCE SYSTEM

BACKGROUND OF THE INVENTION

Field of the Invention

The invention concerns a method for selecting an optimization method and to a corresponding apparatus of a magnetic resonance system.

The invention furthermore relates to a magnetic resonance system having a radiofrequency transmission system, a gradient system, and a control device that is designed to operate the radiofrequency transmission system and the gradient system for the purpose of performing a desired measurement on the basis of a predefined pulse sequence, and having a pulse sequence optimization device.

Description of the Prior Art

In a magnetic resonance system, also known as a magnetic resonance tomography system, the body that is to be examined is typically exposed to a relatively high basic magnetic field, of 1, 3, 5 or 7 tesla for example, by a basic field magnet system. In addition, a magnetic field gradient is applied by a gradient system. Radiofrequency excitation signals (RF signals) are then transmitted by a radiofrequency transmission system via suitable antenna devices, so as to cause nuclear spins of specific atoms to be excited into resonance by the radiofrequency field, and thus deflected through a defined flip angle with respect to the magnetic field lines of the basic magnetic field. Upon relaxation of the nuclear spins, radiofrequency signals, called magnetic resonance signals, are emitted, detected by suitable reception antennas, and then processed further. Finally, the desired image data can be reconstructed from the thus acquired raw data.

Accordingly, it is necessary to transmit a specific pulse sequence for a specific measurement, the pulse sequence being a train of radiofrequency pulses, in particular excitation pulses and refocusing pulses, as well as, matching thereto, gradient pulses that are to be transmitted in a coordinated manner in different spatial directions. Readout windows, matching with respect to time to the pulses, must be set that specify the time periods in which the induced magnetic resonance signals are captured. An important factor for the imaging in this case is the timing within the sequence, i.e. which pulses succeed one another, at which time intervals. A number of control parameters are generally defined in what is termed a measurement protocol, which is created in advance and can be retrieved, from a memory for example, for a specific measurement, and if necessary modified onsite by the operator, who can specify additional control parameters, such as, for example, a specific inter-slice distance of a stack of slices that are to be measured, a slice thickness, etc. A pulse sequence, which is also referred to as a measurement sequence, is then calculated on the basis of all these control parameters.

The gradient pulses are defined by their gradient amplitude, their gradient pulse duration, and the edge steepness, i.e., the first derivative of the pulse shape dG/dt of the gradient pulses, also referred to as the "slew rate". A further important gradient pulse variable is the gradient pulse moment (also referred to as "moment" for short), which is defined by the integral of the gradient amplitude over time.

During a pulse sequence, current supplied to the magnetic gradient coils via which the gradient pulses are emitted is switched frequently and rapidly. Since the time specifications within a pulse sequence are in most cases very strict and in addition the total duration of a pulse sequence, which determines the total duration of an MRT examination, must be kept as short as possible, gradient strengths around 40 mT/m and slew rates of up to 200 mT/m/ms must be achieved at times. In particular, such a high edge steepness contributes to the known noise phenomena during the switching of the gradients. Eddy currents in other components of the magnetic resonance tomography system, in particular the radiofrequency shield, are one reason for this unwanted noise. In addition, steep edges of the gradients lead to a higher energy consumption and furthermore impose greater demands on the gradient coils and the other hardware. The rapidly changing gradient fields lead to distortions and oscillations in the gradient coils and cause the energies to be transmitted to the housing. If superconducting coils are used in the basic field magnet, a high level of helium boil-off can furthermore result due to heating of the cryogen vessel and the other components.

Various optimization methods have been proposed in order to reduce such noise. In DE 10 2013 202 559, for example, a method is described in which an inherently ready-to-use pulse sequence that is to be sent to the scanner of the magnetic resonance system is analyzed in order to determine a time interval that is to be optimized with respect to a gradient waveform or a gradient pulse thereof, such a time interval being referred to below also as an optimization interval, or a pulse sequence segment that is to be optimized with respect to noise development and/or energy consumption, within the pulse sequence. In this case, in a first step, all original commands that are sent to the scanner are intercepted, then, in a second step, are investigated initially for optimizable sections. These sections are optimized in a third step, and only in a fourth step is the optimized pulse sequence then relayed to the MR scanner. The optimization is performed, preferably with the use of a spline interpolation that fulfills specific boundary conditions, such as, inter alia, a specific gradient moment, a specific amplitude at predefined node points, in particular at a start time point of the respective interval and at an end time point of the respective interval. A maximally smooth gradient waveform with rounded edges is generated by the spline interpolation.

Furthermore, there is also the possibility of replacing gradient waveforms by linear or trapezoidal gradient waveforms, wherein the gradients are not rounded off, but the lowest possible slew rates (=dG/dt) are achieved. A method of said type is described in DE 10 2013 225 415.

An advantage of the spline optimization method is that by rounding off the gradients it is possible to minimize eddy currents, whereas in the case of the optimization by linear or trapezoidal gradient waveforms, lower slew rates are made possible and a shorter computation time is required. There are also differences between the two optimization methods in the resulting acoustic spectrum: As a result of the gradient edges being rounded off in the spline optimization method the acoustic profile is shifted in the direction of low frequencies. This causes the noises to become more muted. In the case of the optimization by means of linear or trapezoidal gradient waveforms, in contrast, the distribution of the spectrum is hardly changed, but instead the total amplitude of the peaks is reduced.

Depending on the acoustic transmission function of the MR scanner and the protocol or sequence used, it is possible in this case that better or worse results will be achieved using the first or the second optimization method. If, for example, the transmission function of an MR scanner reproduces high frequencies particularly loudly, it is advantageous if the gradients are rounded off by the spline optimization method, whereas in the case of an MR scanner that reproduces low frequencies particularly loudly it may be that the shifting of the frequencies from high to low, as is made possible by the spline optimization method, is less advantageous than the use of the optimization method based on linear or trapezoidal gradient waveforms.

It is therefore generally unclear which method is the optimal one for which MR scanner and which sequence. Accordingly, it is difficult to identify the optimization method that will result in an optimized pulse sequence that minimizes the patient's exposure to noise.

An object of the present invention therefore consists in minimizing the noise to which patients are exposed.

This object is achieved by means of a method as claimed in claim 1, by means of an apparatus as claimed in claim 10, and by means of a magnetic resonance system as claimed in claim 11.

In the method according to the invention, frequency spectra of a plurality of pulse sequence segments generated by means of different optimization methods are initially determined. The frequency spectra correspond to the pulse sequences that are generated for actuating the MR scanners. In addition, an overall spectrum of the respective pulse sequence segments generated by means of different optimization methods is determined as a function of the respective determined frequency spectra and a transmission function of an MR scanner. More precisely, the determined frequency spectra are in each case multiplied by a transmission function of an MR scanner. The transmission function reflects the relationship between the sound amplitude or loudness and the amplitude of the frequency spectrum as a function of the frequency. The overall spectrum can be considered as the sound level or sound amplitude or loudness as a function of the frequency. The transmission function is individually different for each MR scanner based on its design and can be determined in advance for example by means of a one-off measurement. Said measurement can be realized for example by generating gradients at a constant amplitude in a pulse sequence and varying the frequency thereof. For example, a separate transmission function can be determined for each axis of the gradient system, i.e. for the respective gradient coils in the x-direction, in the y-direction and in the z-direction. An average transmission function can furthermore be computed from the three transmission functions. Finally, the optimization method having the most favorable assigned overall spectrum in respect of a criterion is selected for the respective pulse sequence segment. What is to be understood by an optimization interval is the optimization interval defined in DE 10 2013 202 559, in other words a pulse sequence segment that is suitable for the optimization by means of one of the cited optimization methods. The overall spectrum represents the acoustic spectrum of the magnetic resonance system, which is dependent both on the transmission function of the MR scanner and on the pulse sequence used.

The apparatus according to the invention comprises a frequency spectrum determination unit which is configured for determining the frequency spectrum of a plurality of pulse sequence segments generated by means of different optimization methods. In addition, the apparatus according to the invention has an overall spectrum determination unit which is configured for determining the overall spectra of the respective pulse sequence segments generated by means of different optimization methods as a function of the respective determined frequency spectra and a transmission function of an MR scanner. Lastly, the apparatus according to the invention also has a selection unit which is configured for selecting the optimization method having the most favorable assigned overall spectrum in respect of a criterion for the respective pulse sequence segment.

The magnetic resonance system according to the invention includes the apparatus according to the invention.

The invention also comprises a computer program which can be loaded directly into a memory of the apparatus according to the invention, said computer program having program code sections for performing all of the steps of the method according to the invention when the program is executed in the apparatus according to the invention. Such a realization in software has the advantage that existing control devices of magnetic resonance systems can be modified by implementation of the program in a suitable way in order to optimize pulse sequences in the inventive manner, which is associated for example with the above-cited advantages.

The dependent claims and the following description contain particularly advantageous developments and embodiments of the invention, wherein in particular the claims of one category can also be developed analogously to the dependent claims of a different claims category.

In one embodiment of the invention, the pulse sequence segment can be an optimization interval of a pulse sequence.

By an optimization interval is to be understood, as already mentioned, a pulse sequence time interval which can be optimized in respect of a gradient waveform.

Alternatively, the pulse sequence segment can comprise a plurality of optimization intervals of a pulse sequence. The choice of the length of the pulse sequence segment can depend for example on the computational speed of the individual components of the apparatus according to the invention.

The pulse sequence segment can also comprise an entire pulse sequence that is to be generated.

In one embodiment of the method according to the invention, the criterion can comprise the sound pressure and/or the loudness and/or the roughness and/or the sharpness of the overall spectrum of the pulse sequence segment.

More precisely, the criterion can comprise the selection of the optimization method having the overall spectrum that has the lowest sound pressure and/or the lowest loudness and/or the lowest roughness and/or the lowest sharpness. Whereas the sound pressure is a purely physical variable, loudness, roughness and sharpness also include the human perception of the cited physical phenomenon, i.e. these are what are termed psychoacoustic variables. With regard to loudness, in particular the frequency-dependent sensitivity of the sense of hearing is taken into account. With regard to sharpness, the perception of timbre is taken into account.

It is characterized acoustically by the envelope of the spectrum. It is not important in this case whether the spectrum is continuous in terms of noise level or consists of discrete, i.e. for example harmonic, components. In a narrowband sound spectrum, the sharpness increases with the center frequency of the frequency spectrum; in the case of a band limitation on one side only, the sharpness increases with the lower cutoff frequency and—much more strongly—with the upper cutoff frequency. Apart from the cutoff frequencies, the shape of the envelope has an influence on the tone sharpness. The harshness or roughness is perceived particularly in the case of frequency- and amplitude-modulated sounds.

Gradient optimization methods can preferably be employed as optimization methods.

In a special embodiment, the optimization methods can comprise a spline generation method and a method for optimizing a gradient pulse by means of a linear or trapezoidal gradient pulse waveform.

Whereas the spline method is suitable in particular in the case of MR scanners having a transmission function that has low values for low frequencies, the method for optimizing a gradient pulse by means of a linear or trapezoidal gradient pulse waveform can be used by preference for MR scanners having a transmission function that has higher values for low frequencies. However, the use of the different optimization methods is also dependent on the frequency spectrum of the pulse sequences, which means that a simple estimation would not be reliable and in this case the method according to the invention holds out the prospect of better results being achieved in respect of noise optimization.

The method can advantageously be carried out separately for each pulse sequence segment of a pulse sequence. Accordingly, the individually most favorable optimization method can be determined and selected for each of the pulse sequence segments, as a result of which the noise exposure can be particularly effectively reduced.

According to a particularly advantageous embodiment variant, the gradient optimization can be effected such that on average the overall spectrum reaches as low a value as possible on the dB(A) or sone scale.

SUMMARY OF THE INVENTION

An object of the present invention is to minimize the noise to which patients are exposed in the course of a magnetic resonance examination.

This object is achieved in the method according to the invention, wherein frequency spectra of a plurality of pulse sequence segments, that are generated by different optimization methods, are initially determined. The frequency spectra correspond to the pulse sequences that are generated for actuating the MR scanners. In addition, an overall spectrum of the respective pulse sequence segments generated by the different optimization methods is determined as a function of the respective determined frequency spectra and a transmission function of the MR scanner that is to be used for the examination. More precisely, the determined frequency spectra are in each case multiplied by this transmission function of the MR scanner. The transmission function reflects the relationship between the sound amplitude or loudness and the amplitude of the frequency spectrum as a function of the frequency. The overall spectrum can be considered as the sound level or sound amplitude or loudness as a function of the frequency. The transmission function is individually different for each MR scanner based on its design, and can be determined in advance for example by a one-time measurement. This measurement can be made, for example, by generating gradients at a constant amplitude in a pulse sequence and varying the frequency thereof. For example, a separate transmission function can be determined for each axis of the gradient system, i.e. for the respective gradient coils in the x-direction, in the y-direction and in the z-direction. An average transmission function can furthermore be computed from the three transmission functions. Finally, the optimization method having the most favorable assigned overall spectrum with respect to a selected criterion is selected for the respective pulse sequence segment. As used herein, the optimization interval is the optimization interval defined in DE 10 2013 202 559, in other words a pulse sequence segment that is suitable for the optimization by one of the cited optimization methods. The overall spectrum represents the acoustic spectrum of the magnetic resonance system, which is dependent both on the transmission function of the MR scanner and on the pulse sequence used.

The apparatus according to the invention has a frequency spectrum determination unit configured to determine the frequency spectrum of a number of pulse sequence segments generated by different optimization methods. In addition, the apparatus according to the invention has an overall spectrum determination unit configured to determine the overall spectra of the respective pulse sequence segments generated by different optimization methods as a function of the respective determined frequency spectra and a transmission function of the MR scanner. The apparatus according to the invention also has a selection unit configured to select the optimization method having the most favorable assigned overall spectrum in respect of a criterion for the respective pulse sequence segment. These units can be separate processors or distributed portions of a single processor or computer.

The magnetic resonance system according to the invention includes the apparatus according to the invention.

The invention also encompasses a non-transitory computer readable data storage medium encoded with program having instructions, which can be loaded directly into a memory of the apparatus according to the invention. The computer program having program code sections for performing all of the steps of the method according to the invention when the program is executed in the apparatus according to the invention. Such a realization in software has the advantage that existing control devices of magnetic resonance systems can be modified by implementation of the program in a suitable way in order to optimize pulse sequences in the inventive manner, which is associated for example with the above-cited advantages.

In an embodiment of the invention, the pulse sequence segment can be an optimization interval of a pulse sequence. Such an optimization interval, as mentioned, is a pulse sequence time interval that can be optimized with respect to a gradient waveform.

Alternatively, the pulse sequence segment can have multiple optimization intervals of a pulse sequence. The choice of the length of the pulse sequence segment can depend, for example, on the computational speed of the individual components of the apparatus according to the invention.

The pulse sequence segment can also be the entire pulse sequence that is to be generated.

In an embodiment of the method according to the invention, the criterion can be the sound pressure and/or the loudness and/or the roughness and/or the sharpness of the overall spectrum of the pulse sequence segment.

More precisely, the criterion can be the selection of the optimization method having the overall spectrum that has the lowest sound pressure and/or the lowest loudness and/or the lowest roughness and/or the lowest sharpness. Whereas the sound pressure is a purely physical variable, loudness, roughness and sharpness also include the human perception of these physical phenomenon, i.e. these are termed psychoacoustic variables. With regard to loudness, in particular the frequency-dependent sensitivity of the sense of hearing is taken into account. With regard to sharpness, the perception of timbre is taken into account, and sharpness is characterized acoustically by the envelope of the spectrum. It is not important in this case whether the spectrum is continuous in terms of noise level or is composed of discrete, i.e. for example harmonic, components. In a narrowband sound spectrum, the sharpness increases with the center frequency of the frequency spectrum; in the case of a band limitation on one side only, the sharpness increases with the lower cutoff frequency and—much more strongly—with the upper cutoff frequency. Apart from the cutoff frequencies, the shape of the envelope has an influence on the tone sharpness. The harshness or roughness is perceived particularly in the case of frequency- and amplitude-modulated sounds.

Gradient optimization methods can preferably be employed as optimization methods.

The optimization methods can include a spline generation method and a method for optimizing a gradient pulse by a linear or trapezoidal gradient pulse waveform.

Whereas the spline method is suitable in the case of MR scanners having a transmission function that has low values for low frequencies, the method for optimizing a gradient pulse by a linear or trapezoidal gradient pulse waveform is preferably used for MR scanners having a transmission function that has higher values for low frequencies. However, the use of the different optimization methods is also dependent on the frequency spectrum of the pulse sequences, which means that a simple estimation would not be reliable and in this case the method according to the invention holds out the prospect of better results being achieved with respect to noise optimization.

The method can advantageously be carried out separately for each pulse sequence segment of a pulse sequence. Accordingly, the individually most favorable optimization method can be determined and selected for each of the pulse sequence segments, as a result of which the noise exposure can be particularly effectively reduced.

According to a particularly advantageous embodiment variant, the gradient optimization can be effected such that on average the overall spectrum reaches as low a value as possible on the dB(A) or sone scale.

DESCRIPTION OF THE PREFERRED EMBODIMENTS

Figure 1:
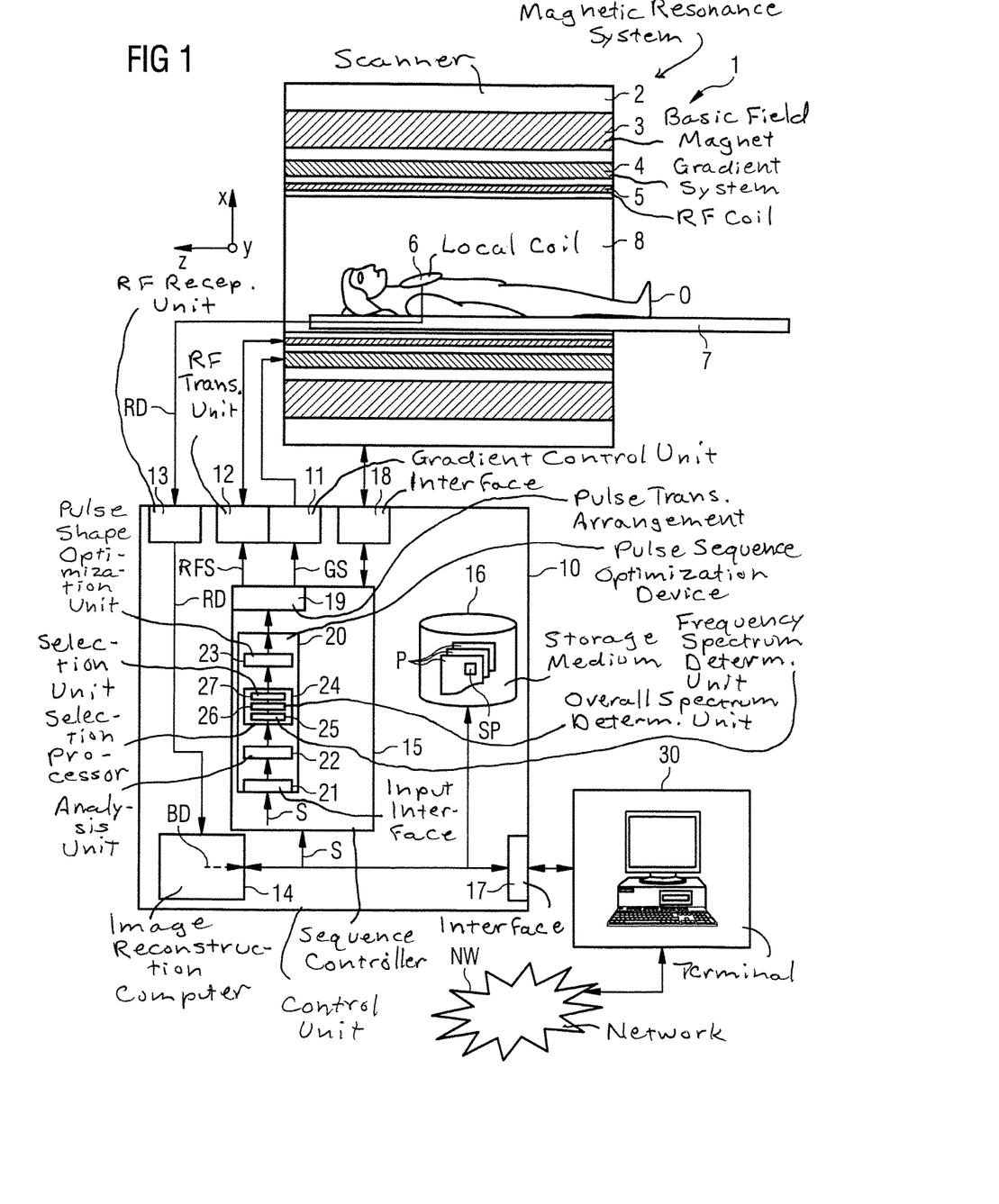
FIG. 1 is a schematic illustration of a magnetic resonance system according to an exemplary embodiment of the invention.

In FIG. 1 shows a magnetic resonance system 1 according to the invention in schematic form. The system 1 includes the actual magnetic resonance scanner (MR scanner) 2 having an examination chamber 8 or patient tunnel 8 contained therein. A bed 7 can be introduced into the patient tunnel 8 so that, during an examination, a patient O or examination subject lying thereon can be placed at a specific position within the magnetic resonance scanner 2 relative to the magnet system and radiofrequency system arranged therein, or, as needed, can be moved between different positions during a measurement.

Basic components of the magnetic resonance scanner 2 are a basic field magnet 3, a gradient system 4 having gradient coils for generating magnetic field gradients in the x-, y- and z-directions, and a whole-body radiofrequency (RF) coil 5. The magnetic field gradient coils in the x-, y- and z-directions can be operated (supplied with current) independently of one another, such that it is possible, by a predefined combination, to apply gradients in any of the spatial directions that are common in the operation of a MR apparatus (for example in the slice selection direction, in the phase encoding direction or in the readout direction), the other directions generally being dependent on the chosen slice orientation. Alternatively, the spatial directions can coincide with the x-, y- and z-directions, for example slice selection direction in the z-direction, phase encoding direction in the y-direction, and readout direction in the x-direction. Magnetic resonance signals induced in the examination object O can be received via the whole-body coil 5, from which the radiofrequency signals for inducing the magnetic resonance signals are generally also transmitted. Usually, however, the MR signals are received by a local coil array 6 composed of local coils (only one of which is shown here) placed for example on or under the patient O. All of these components are generally known to those skilled in the art and therefore are shown only in schematic form in FIG. 1.

The components of the magnetic resonance scanner 2 are operated by a control device 10, which can be a control computer that may be formed by a number of individual computers, which may be spatially separated and interconnected via suitable cables or the like. The control device 10 is connected via a terminal interface 17 to a terminal 30 via which an operator is able to control the entire system 1. In the present case, the terminal 30 is equipped as a computer having a keyboard, one or more screens and further input devices such as a mouse or the like, for example, such that a graphical user interface is available to the operator.

The control device 10 has, among other components, a gradient control unit 11, which also may be composed of a number of subcomponents. Control signals are applied to the individual gradient coils from the gradient control unit 11 in accordance with a gradient pulse sequence GS. These pulses are, as described above, gradient pulses that, during a measurement, are set (emitted) at precisely designated positions with respect to time, and with a precisely predefined time characteristic.

In addition, the control device 10 has a radiofrequency RF transmission unit 12 in order to radiate radiofrequency pulses into the whole-body radiofrequency coil 5 in each case in accordance with a predefined radiofrequency pulse sequence RFS of the pulse sequence S. The radiofrequency pulse sequence RFS includes the aforementioned excitation and refocusing pulses. The magnetic resonance signals are then received by the local coil array 6, and the raw data RD received thereby is read out and processed by an RF reception unit 13. The magnetic resonance signals are provided in digital form as raw data RD to image reconstruction computer 14, which reconstructs the image data BD therefrom and stores the image data BD in a storage medium 16 and/or transfers the image data BD via the interface 17 to the terminal 30 so that the operator can view it. The image data BD can also be stored at other locations via a network NW and/or displayed and evaluated. Alternatively, a radiofrequency pulse sequence can be transmitted via the local coil array and/or the magnetic resonance signals can be received by the whole-body radiofrequency coil (not shown), depending on the current connection arrangement of the whole-body radiofrequency coil 5 and the coil arrays 6 to the radiofrequency transmission unit 12 or RF reception unit 13.

Control commands to other components of the magnetic resonance scanner 2, such as e.g. the bed 7 or the basic field magnet 3, are transmitted, or measured values or other information are received, via a further interface 18.

The gradient control unit 11, the RF transmission unit 12 and the RF reception unit 13 are in each case actuated in a coordinated manner by a sequence controller 15. The sequence controller ensures, by appropriate commands, that the desired gradient pulse sequences GS and radiofrequency pulse sequences RFS are transmitted. In addition it must be ensured that the magnetic resonance signals at the local coils of the local coil array 6 are read out at the appropriate point in time by the RF reception unit 13 and processed further. The sequence controller unit 15 also controls the interface 18. The sequence controller 15 can be, for example, a processor or a number of interacting processors. A pulse sequence optimization device 20 and a selection device 24 in accordance with the invention for selecting an optimization method, which will be explained in detail below, can be implemented therein, e.g. in the form of suitable software components.

The basic workflow sequence of such a magnetic resonance measurement and the cited control components (apart from the pulse sequence optimization device 20 specifically described herein) are known to those skilled in the art, and thus need not be described in further detail herein. Such a magnetic resonance scanner 2 and the associated control device may also include a number of other known components, that need not be explained in detail herein. The magnetic resonance scanner 2 can be constructed with a different design, for example having a patient chamber that is open at the side, or as a smaller scanner in which only a part of the body can be positioned.

In order to start a measurement (data acquisition), an operator can typically select, via the terminal 30, a control protocol P provided for the measurement from a storage medium 16 in which a number of control protocols P for different measurements are stored. The control protocol P contains, inter alia, various control parameters SP for the respective measurement. The control parameters SP include certain basic specifications for the desired pulse sequence, for example the sequence type, i.e. whether it is a spin echo sequence, a turbo spin echo sequence, etc. Also included therein are control parameters with respect to the magnetizations (of nuclear spins) to be achieved by means of the individual radiofrequency pulses, specifications concerning a k-space gradient trajectory that is to be traversed for the acquisition of raw data, as well as, in addition, slice thicknesses, inter-slice distances, number of slices, resolution, repetition times, the echo times in a spin echo sequence, etc.

The operator can modify some of the control parameters via the terminal 30 in order to create an individual control protocol for a currently desired measurement. To that end, modifiable control parameters are presented for modification, for example at a graphical user interface of the terminal 30.

Alternatively, the operator can download control protocols via a network NW, for example from a manufacturer of the magnetic resonance system, and then possibly modify these as necessary and use them.

Based on the control parameters SP, a pulse sequence S or measurement sequence is then determined by means of which ultimately the actual control of the remaining components is effected by means of the sequence controller 15. The pulse sequence S can be calculated or designed in a pulse sequence determination device which can be realized for example in the form of software components on the computer of the terminal 30. In principle, however, the pulse sequence determination device can also be part of the control device 10 itself, in particular of the sequence controller 15. The pulse sequence determination device could also be implemented on a separate computing system that is connected to the magnetic resonance system via the network NW, for example.

When a pulse sequence S is processed, it is initially optimized by the measurement control unit 15 in a pulse sequence optimization device 20 before being supplied via a pulse transmission arrangement 19 to the sequence controller 15, which finally transfers the radiofrequency pulse sequence RFS to the RF transmission unit 12 and the gradient pulse sequence GS to the gradient control unit 11. For this purpose, the pulse sequence optimization device 20 contains an input interface 21 for receiving the actually finished, ready-to-transmit, but still to be optimized, pulse sequence S and transferring the same to an analysis unit 22 which performs the analysis of the pulse sequence in order to identify fixed-point time ranges and variable time intervals that may be optimized. The analysis unit 22 forms, for example, the time interval determination unit for determining a time interval that is to be optimized with respect to the gradient waveform.

The pulse shape of gradient pulses in the variable time intervals is then optimized in a pulse shape optimization unit 23. In this case, however, different optimization methods can be used. Different optimization methods can be better suited with regard to noise development, depending on pulse shape or type of the MR scanner. In order to decide which optimization method is individually more suitable, the pulse sequence optimization device 20 includes, in accordance with the invention, a selection processor 24 for selecting an optimization method. The selection processor 24 includes a frequency spectrum determination unit 25 configured to determine the frequency spectrum of a number of pulse sequence segments generated by different optimization methods. For example, the frequency spectra can be determined by a Fourier transformation. In addition, the selection processor 24 has an overall spectrum determination unit 26 configured to determine the overall spectra of the respective pulse sequence segments generated by different optimization methods as a function of the respective determined frequency spectra and a transmission function of an MR scanner. The overall spectrum can be regarded as a sound level as a function of the frequency. The sound level can be regarded as an averaging or weighting of the overall spectrum or, as the case may be, as a weighted integration of the overall spectrum over the frequency. A selection unit 27 is configured to select the optimization method having the most favorable assigned overall spectrum in respect of a criterion for the respective pulse sequence segment.

Alternatively, the selection processor 24 according to the invention can be part of the pulse shape optimization unit 23.

Figure 2:
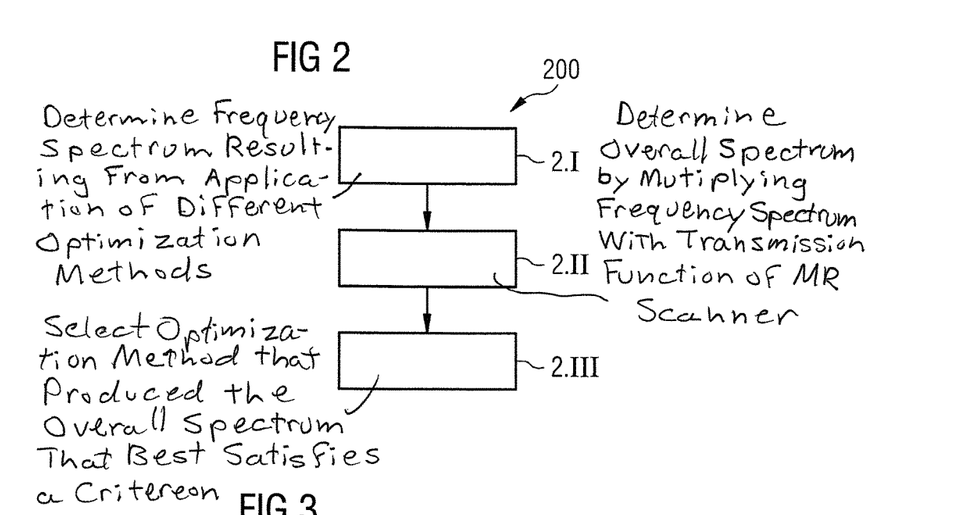
FIG. 2 is a flowchart of the basic steps of the method according to the invention.

FIG. 2 is a flowchart illustrating a method according to a first exemplary embodiment of the invention. The appropriate gradient optimization method for the protocol that is to be measured or for the sequence that is to be generated is determined with the use of the method as a function of the scanner type. In a first step 2.I, the spectra of the protocol that is to be measured are in this case calculated for at least two different optimization methods. These are then computed in a second step 2.II using the transmission function of the MR scanner. This can be realized, for example, by multiplication of the spectra with the transmission function. Accordingly, the expected overall spectrum of the measurement is determined for the at least two different optimization methods. In a third step 2.III, that optimization method from which a greater noise reduction is to be expected is selected.

According to a first exemplary embodiment of the method, this calculation is carried out once at the start of the optimization and then retained for the entire protocol.

Alternatively, the above-described method can be carried out separately for each optimization interval during the optimization of the protocol so that different gradient optimizations can be applied during the optimization of a protocol.

An automatic calculation of a preferred gradient optimization method is realized by the described method. The result is in this case dependent on the protocol that is to be measured and on the acoustic transmission function of the MR scanner used.

As noted, the steps can be performed once, preferably at the start of the optimization, or alternatively can be repeated individually for each optimizable interval.

It is also possible to combine the two alternative variants of the method according to the invention, i.e. for example to apply the method only once in each case for pulse sequence segments composed of multiple optimization intervals, in other words to specify an optimization method block by block. In this case different optimization methods can be applied in different pulse sequence segments.

By the method according to the invention, the gradient optimization is adapted in a preferred manner to the respective transmission function of the MR scanner type and an optimal distribution of the frequency peaks is achieved for the protocol that is to be measured.

Figure 3:
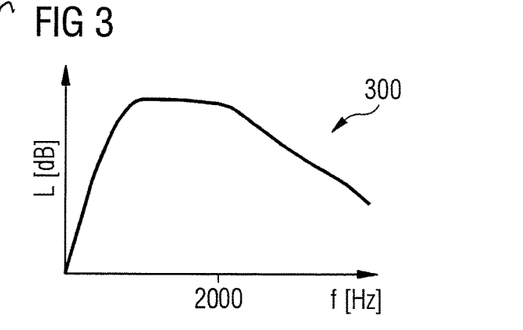
FIG. 3 is a graph representing the transmission function of a first magnetic resonance scanner.
Figure 4:
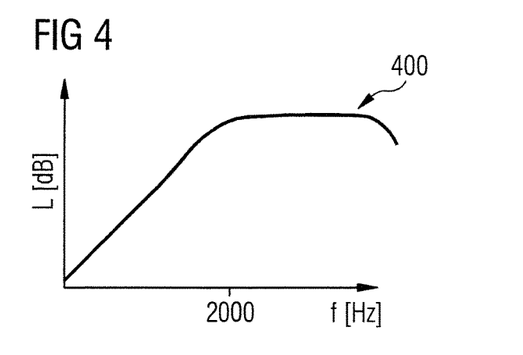
FIG. 4 is a graph representing the transmission function of a second magnetic resonance scanner.

Depending on the design of the MR scanner and hardware used therefor, a different loudness is caused as a function of the frequency. This behavior is defined by means of the aforementioned transmission function. FIGS. 3 and 4 show different transmission functions of two different MR scanners. The loudness L in decibels is plotted as a function of the frequency f in hertz.

Whereas the MR scanner in FIG. 3 reproduces predominantly low frequencies more loudly, the MR scanner in FIG. 4 reproduces high frequencies >2000 Hz particularly loudly. Every MR measurement has a specific sound pattern that can be represented by the acoustic spectrum as a function of its specific settings such as the sequence type, the echo time, the repetition time TR, etc. In this case peaks are produced at different frequencies, such as e.g. at the frequency 1/TR and the harmonics of the cited frequency. This frequency distribution is reproduced according to the transmission function of the MR scanner and is to be heard as more or less loud noise.

A different frequency distribution of the measurement is achieved by the different optimization methods. As described, the spline optimization method shifts the frequency spectrum in the direction of low frequencies, whereas the method for optimizing a gradient pulse by a linear or trapezoidal gradient pulse waveform generally reduces all of the peaks to an equally strong extent. For the MR scanner characterized by the graph shown in FIG. 3, a shift from high to low frequencies would be advantageous, since these are reproduced particularly quietly by the MR scanner in FIG. 3. The situation is precisely the reverse for the MR scanner characterized by the graph shown in FIG. 4. There, low frequencies are reproduced more loudly. Accordingly, the method for optimizing a gradient pulse by means of a linear or trapezoidal gradient waveform would be advantageous in this case. However, this result can vary, depending on the protocol that is to be measured. An advantageous optimization method is therefore determined by means of the method according to the invention for any measurement and MR scanner type.

Although modifications and changes may be suggested by those skilled in the art, it is the intention of the inventor to embody within the patent warranted hereon all changes and modifications as reasonably and properly come within the scope of their contribution to the art.

I claim as my invention:

1. A method for selecting an optimization method for optimizing a pulse sequence that operates a magnetic resonance scanner comprising a radiofrequency coil system and a gradient coil system, said pulse sequence comprising a plurality of radiofrequency pulses and gradient pulses that respectively activate said radiofrequency coil system and said gradient coil system in order to acquire magnetic resonance data from a subject in said magnetic resonance scanner, said method comprising:

providing said pulse sequence to a computer;

in said computer, automatically analyzing said pulse sequence to identify at least one segment thereof that is to be optimized;

in said computer, automatically applying a plurality of different optimization methods to said at least one segment and thereby obtaining a plurality of differently optimized forms of said at least one segment, said plurality of optimization methods comprising, a spline generation method, and a method for generating a gradient pulse by replacing a gradient waveform thereof by linear or trapezoidal gradient waveforms;

in said computer, for each of said differently optimized forms of said at least one segment, determining a frequency spectrum thereof;

in said computer, for each differently optimized form of said at least one segment, automatically determining an overall spectrum by multiplying the determined frequency spectrum of the respective differently optimized form of said at least one segment with a transmission function of said magnetic resonance scanner, thereby producing a plurality of overall spectra;

in said computer, applying a predetermined criterion to each overall spectrum in said plurality of overall spectra, and identifying an overall spectrum in said plurality of overall spectra that best satisfies said criterion and selecting an optimization method, as a selected optimization method among said plurality of optimization methods, that produced the overall spectrum that best satisfies said criterion;

in said computer, optimizing said pulse sequence so as to include said at least one segment thereof optimized by said selected optimization method, thereby producing an optimized pulse sequence; and in said computer, generating control signals corresponding to said optimized pulse sequence and emitting said control signals from said computer to said magnetic resonance scanner in order to operate the magnetic resonance scanner so as to execute said optimized pulse sequence and thereby acquire said magnetic resonance data from the subject.

2. The method as claimed in claim 1 comprising analyzing said pulse sequence to identify said at least one pulse sequence segment thereof that is an optimization interval of said pulse sequence.

3. The method as claimed in claim 1 comprising analyzing said pulse sequence to identify a plurality of pulse sequence segments therein that are to be optimized.

4. The method as claimed in claim 3 comprising analyzing said pulse sequence to identify said plurality of pulse sequence segments therein that are to be optimized, as respective optimization intervals of said pulse sequence.

5. The method as claimed in claim 1 wherein said pulse sequence segment comprises an entirety of said pulse sequence.

6. The method as claimed in claim 1 wherein said transmission function of said magnetic resonance scanner is an acoustic transmission function of said magnetic resonance scanner, and comprising employing, as said criterion in said computer, a criterion selected from the group consisting of sound pressure, loudness, roughness, and sharpness of each overall spectrum.

7. The method as claimed in claim 6 comprising selecting, as said selected optimization method, the optimization method among said plurality of optimization methods that produced an overall spectrum that, when said criterion is applied thereto, produced a result selected from the group consisting of a lowest sound pressure, a lowest loudness, a lowest roughness, and lowest sharpness.

8. The method as claimed in claim 1 comprising employing, as said plurality of optimization methods, a plurality of different gradient pulse optimization methods.

9. The method as claimed in claim 1 comprising analyzing said pulse sequence to identify a plurality of segments thereof and, separately for each segment, determining said frequency spectrum, determining said overall spectrum, and applying said criterion to the determined overall spectrum thereof.

10. The method as claimed in claim 1 wherein applying said plurality of different optimization methods to said at least one segment, and multiplying each of the respective differently optimized forms of said at least one segment with said transmission function, gives each overall spectrum in said plurality of overall spectra a different frequency distribution and using, as said predetermined criterion to select an optimization method, a criterion that selects the optimization method among said plurality of optimization methods that produced a frequency in an overall spectrum that best reduces audible noise produced by said magnetic resonance scanner when said optimized pulse sequence is executed by said magnetic resonance scanner.

11. A magnetic resonance apparatus, comprising:
a magnetic resonance scanner comprising a radiofrequency coil system and a gradient coil system, said magnetic resonance scanner comprising a scanner structure having a transmission function;
a control computer configured to operate said magnetic resonance scanner according to a pulse sequence comprising a plurality of radiofrequency pulses and a plurality of gradient pulses that respectively activate said radiofrequency coil system and said gradient coil system in order to acquire magnetic resonance data from a subject in said magnetic resonance scanner;
said control computer being configured to automatically analyze said pulse sequence to identify at least one segment thereof that is to be optimized;
said control computer being configured to automatically apply a plurality of different optimization methods to said at least one segment and thereby obtain a plurality of differently optimized forms of said at least one segment, said plurality of optimization methods comprising, a spline generation method, and a method for generating a gradient pulse by replacing a gradient waveform thereof by linear or trapezoidal gradient waveforms;
said computer, for each of said differently optimized forms of said at least one segment, being configured to determine a frequency spectrum thereof;
said control computer, for each differently optimized form of said at least one segment, being configured to automatically determine an overall spectrum by multiplying the determined frequency spectrum of the respective differently optimized form of said at least one segment with said transmission function of said magnetic resonance scanner, thereby producing a plurality of overall spectra:
said control computer being configured to apply a predetermined criterion to each overall spectrum in said plurality of overall spectra, and identify an overall spectrum in said plurality of overall spectra that best satisfies said criterion and select an optimization method, as a selected optimization method among said plurality of optimization methods, that produced the overall spectrum that best satisfies said criterion;
said computer being configured to optimize said pulse sequence so as to include said at least one segment thereof optimized by said selected optimization method, thereby producing an optimized pulse sequence: and
said computer being configured to generate control signals corresponding to said optimized pulse sequence and to emit said control signals from said computer to said magnetic resonance scanner in order to operate the magnetic resonance scanner so as to execute said optimized pulse sequence and thereby acquire said magnetic resonance data from the subject.

12. The apparatus as claimed in claim 11 wherein said computer is configured to apply said plurality of different optimization methods to said at least one segment, and multiply each of the respective differently optimized forms of said at least one segment with said transmission function, so as to give each overall spectrum in said plurality of overall spectra a different frequency distribution, and wherein said computer is configured to use, as said predetermined criterion to select an optimization method, a criterion that selects the optimization method among said plurality of optimization methods that produced a frequency in an overall spectrum that best produces audible noise produced by said magnetic resonance scanner when said optimized pulse sequence is executed by said magnetic resonance scanner.

13. A non-transitory, computer-readable data storage medium encoded with programming instructions, said storage medium being loaded in a control computer of a magnetic resonance apparatus, said magnetic resonance apparatus comprising a magnetic resonance scanner comprising a radiofrequency coil system and a gradient coil system, and said programming instructions causing said control computer to:
receive a pulse sequence for operating said magnetic resonance scanner, said pulse sequence comprising a plurality of radio frequency pulses and a plurality of gradient pulses that respectively activate said radiofrequency coil system and said gradient coil system in order to acquire magnetic resonance data from a subject in said magnetic resonance scanner;
automatically analyze said pulse sequence to identify at least one segment thereof that is to be optimized;
automatically apply a plurality of different optimization methods to said at least one segment and thereby obtaining a plurality of differently optimized forms of said at least one segment, said plurality of optimization methods comprising, a spline generation method, and a method for generating a gradient pulse by replacing a gradient waveform thereof by linear or trapezoidal gradient waveforms;

for each of said differently optimized forms of said at least one segment, determine a frequency spectrum thereof;

for each differently optimized form of said at least one segment, automatically determine an overall spectrum by multiplying the determined frequency spectrum of the respective differently optimized form of said at least one segment with a transmission function of said magnetic resonance scanner, thereby producing a plurality of overall spectra;

apply a predetermined criterion to each overall spectrum in said plurality of overall spectra, and identify an overall spectrum in said plurality of overall spectra that best satisfies said criterion and select an optimization method, as a selected optimization method among said plurality of optimization methods, that produced the overall spectrum that best satisfies said criterion;

optimize said pulse sequence so as to include said at least one segment thereof optimized by said selected optimization method, thereby producing an optimized pulse sequence; and generate control signals corresponding to said optimized pulse sequence and emit said control signals from said computer to said magnetic resonance scanner in order to operate the magnetic resonance scanner so as to execute said optimized pulse sequence and thereby acquire said magnetic resonance data from the subject.

14. The data storage medium as claimed in claim 13 wherein said programming instructions cause said computer to apply said plurality of different optimization methods to said at least one segment, and multiply each of the respective differently optimized forms of said at least one segment with said transmission function, so as to give each overall spectrum in said plurality of overall spectra a different frequency distribution, and to use, as said predetermined criterion to select an optimization method, a criterion that selects the optimization method among said plurality of optimization methods that produced a frequency in an overall spectrum that best produces audible noise produced by said magnetic resonance scanner when said optimized pulse sequence is executed by said magnetic resonance scanner.

* * * * *